United States Patent
Morohashi

(10) Patent No.: US 10,014,038 B2
(45) Date of Patent: Jul. 3, 2018

(54) APPARATUSES AND METHODS FOR CHIP IDENTIFICATION IN A MEMORY PACKAGE

(71) Applicant: Micron Technology, Inc., Boise, ID (US)

(72) Inventor: Masaru Morohashi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 6 days.

(21) Appl. No.: 14/746,435

(22) Filed: Jun. 22, 2015

(65) Prior Publication Data

US 2016/0372170 A1    Dec. 22, 2016

(51) Int. Cl.
  *G11C 7/10*   (2006.01)
  *G11C 7/20*   (2006.01)
  *G11C 7/24*   (2006.01)
  *G11C 8/12*   (2006.01)

(52) U.S. Cl.
  CPC .......... *G11C 7/1087* (2013.01); *G11C 7/1084* (2013.01); *G11C 7/20* (2013.01); *G11C 7/24* (2013.01); *G11C 8/12* (2013.01)

(58) Field of Classification Search
  CPC ................................. G11C 7/22; G11C 7/1087
  See application file for complete search history.

(56) References Cited

U.S. PATENT DOCUMENTS

| | | | |
|---|---|---|---|
| 8,076,764 B2 | 12/2011 | Yamada et al. | |
| 2008/0080261 A1* | 4/2008 | Shaeffer | G11C 5/025 365/189.05 |
| 2009/0015291 A1* | 1/2009 | Kim | G11C 7/1045 326/52 |

* cited by examiner

*Primary Examiner* — Mohammed A Bashar
(74) *Attorney, Agent, or Firm* — Dorsey & Whitney LLP

(57) ABSTRACT

Apparatuses, methods, memory packages, and semiconductor chips are disclosed. An example apparatus includes a semiconductor chip including a layer identification setting path circuit configured to receive respective input signals from a plurality of input layer identification setting paths. The layer identification setting path circuit is further configured to change a value of at least one of the respective input signals to generate respective output signals and to provide the respective output signals to a plurality of output layer identification setting paths. The apparatus further includes a identification circuit configured to determine identification information based on the respective input signals and to compare the identification information to received access layer identification information. The identification circuit is configured to process received command signals based on the comparison between the identification information and the access layer identification information.

15 Claims, 7 Drawing Sheets

US 10,014,038 B2

APPARATUSES AND METHODS FOR CHIP IDENTIFICATION IN A MEMORY PACKAGE

DESCRIPTION OF RELATED ART

As miniaturization of semiconductors has been advanced, simple area reduction becomes more and more difficult. Thus, occupied areas may be reduced by stacking chips (e.g., dice) by using through-silicon vias (TSVs), other vertical electrical connections, etc. In stacking the semiconductor chips, it is desired to use a common chip design for all chips to reduce cost as compared with having a different chip design for chips in one or more positions in a stack (e.g., slave and master chips). If chips produced with a common design are stacked, such as a three-dimensional stack, master/slave detection is required for sharing I/O, delay locked loop, commands, adjusting data latch timing, etc.

Conventional techniques for master/slave detection include either a serial transfer method or a Ladder method. The serial transfer method uses a counter to perform a detection operation in response to a signal generated from the Power On signal. The serial method is problematic because it increases initialization time after a power up, such as time corresponding to the stack has to be adjusted, and the size of a delay circuit may be large.

The ladder method employs a configuration to shift a signal received at a first TSV to an adjacent TSV at an output such that it is received at a different relative TSV of the next chip in the stack. The ladder method does not suffer from the time issues, but it requires a larger number of TSVs, and thus takes up substantial real estate on the semiconductor chip. For example, in a case of 4-layer stack, three TSVs are required. Therefore, if the number of stacked layers is N, N−1 TSVs are required for master/slave detection. If the layers of the stack are increased to 8 layers or 16 layers, the number of TSVs becomes quite large.

BRIEF DESCRIPTION OF THE DRAWINGS

FIGS. 3-1 to 3-3 are top, side, and bottom block diagram views of a semiconductor chip according to an embodiment of the disclosure;

DETAILED DESCRIPTION

Certain details are set forth below to provide a sufficient understanding of embodiments of the disclosure. However, it will be clear to one having ordinary skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
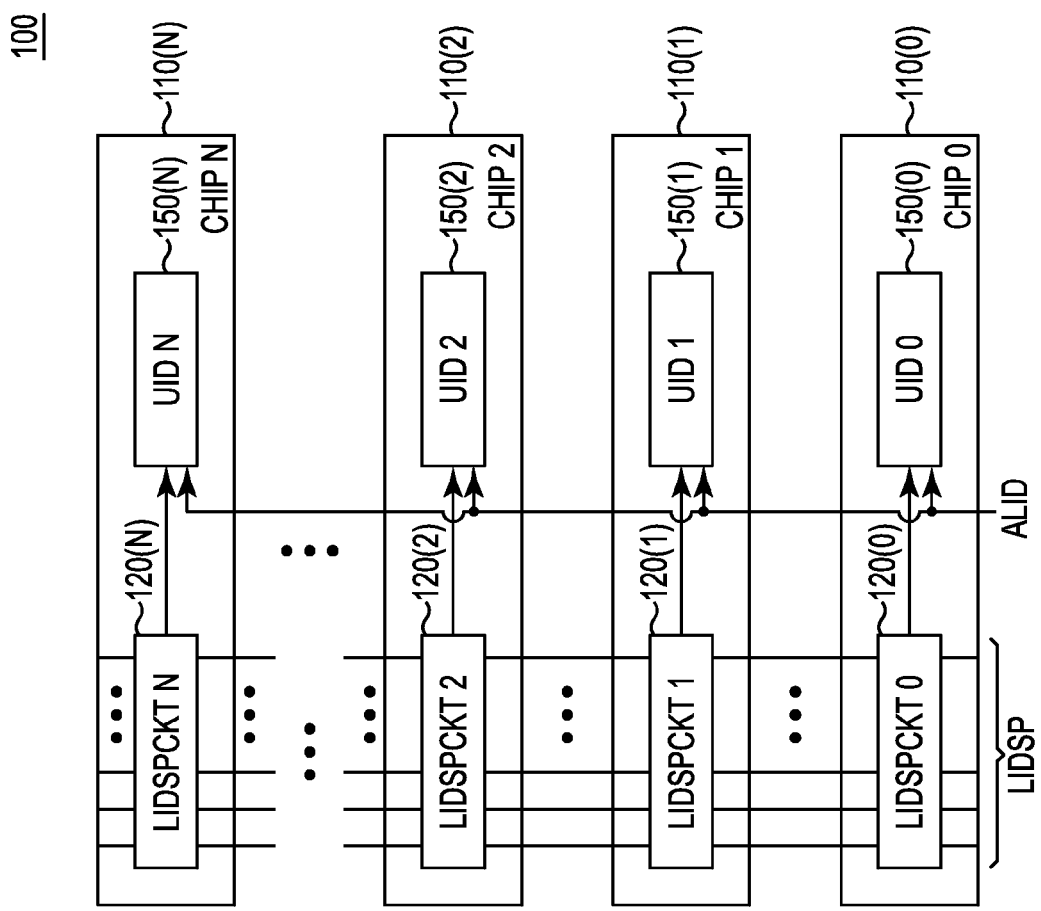
FIG. 1 is a block diagram of a particular illustrative embodiment of an apparatus including unique layer identification circuits in a memory package according to an embodiment of the disclosure.

Referring to FIG. 1, a particular illustrative embodiment of an apparatus 100 including a stack of semiconductor chips 110(0-N) in a memory package (e.g., memory stack or stack) 104 is disclosed and generally designated apparatus 100. The semiconductor chips 110(0-N) may each include memory formed on separate semiconductor die. Each of the semiconductor chips 110(0-N) includes a respective layer identification setting path circuit LIDSP 120(0-N) coupled to a respective UID circuit 150(0-N). The combination of the LIDSP circuit 120(0-N) and the unique layer identification circuit UID 150(0-N) may be used to enable a respective semiconductor chip 110(0-N) when received command signals are directed to the respective semiconductor chip 110 (0-N). Each of the semiconductor chips 110(0-N) further includes an internal circuit (not shown in FIG. 1) as set forth below.

Each of the LIDSP circuits 120(0-N) may receive inputs along LIDSPs from a LIDSP circuit 120(0-N) of the preceding semiconductor chip 110(0-N). Each of the LIDSP circuits 120(0-N) may provide signal values of the inputs on the LIDSPs to the UID circuits 150(0-N), and may adjust output values on the LIDSPs, which may be provided to the LIDSP circuit 120(0-N) of the subsequent semiconductor chip 110(0-N). In some examples, the input LIDSPs on the LIDSP circuit 120(0) may be initialized to certain values, such as to logical low values or '0's. The number of LIDSPs on each of the LIDSP circuits 120(0-N) may be based on a count of the semiconductor chips 110(0-N) in the stack. In one embodiment, the number of LIDSPs may be equal to a $\log_2$ (count of the semiconductor chips 110(0-N)).

Based on the inputs on the LIDSPs received from the respective LIDSP circuits 120(0-N), each of the UID circuits 150(0-N) may hold the inputs as bits to determine unique layer identification information assigned to the corresponding semiconductor chips 110(0-N). Each of the UID circuits 150(0-N) may use the unique identification information to compare with externally supplied access layer identification ALID information to determine whether receive command signals are directed to the corresponding semiconductor chip 110(0-N). In some examples, the unique layer identification information may also be used to identify whether the corresponding semiconductor chip 110(0-N) is a master or slave chip.

During operation, except for an end semiconductor chip 110(0 or N), the LIDSP circuits 120(0-N) of each of the semiconductor chips 110(0-N) may receive a set of inputs on the LIDSPs from a preceding semiconductor chip 110(0-N), and may adjust a value of one or more of the inputs to provide an output on the LIDSPs to a subsequent semiconductor chip 110(0-N). In one embodiment, for example, the LIDSP circuits 120(0-N) of each of the semiconductor chips 110(0-N) may invert a value of one of the inputs and leave values of one or ones of rest of the inputs the same to provide an output on the LIDSPs to a subsequent semiconductor chips 110(0-N). As a result, the unique layer identification information assigned to the semiconductor chips 110(0-N) may change in the Gray code manner along a stacked order. The LIDSP circuits 120(0) of semiconductor chips 110(0) on one end of stack have the LIDSPs initialized to first values, such as all LIDSPs being initialized to logical low values. Each of the LIDSP circuits 120(0-N) may provide the received inputs on the LIDSPs to the UID circuits 150(0-N). In some embodiments, after a short initialization time period to allow the inputs on the LIDSPs at each of the LIDSP circuits 120(0-N) to settle into a fixed value, the respective UID circuit 150(0-N) for each of the semiconductor chips 110(0-N) may latch the inputs as assigned unique layer identification information. Each of the semiconductor chips 110(0-N) may use the unique identification information to compare with externally supplied ALID information to determine whether received command signals are directed to the corresponding semiconductor chip 110(0-N). A count of the LIDSP inputs may be based on a count of the semiconductor chips 110(0-N). For example, if the stack has N+1 chips, the number of inputs required may be $\log_2(N+1)$. In some embodiments, the respective UID circuits 150(0-N) for each of the semiconductor chips 110(0-N) may also use the unique layer identification information to determine whether the corresponding semiconductor chip 110(0-N) is a master chip or a slave chip.

In some examples, the memory package 104 may be coupled to an interface chip, and the semiconductor chips 110(0-N) may not be distinguished between master and slave chips. Using a binary counting scheme to determine the assigned unique layer identification information to determine master and slave chips, and/or to determine when to respond to receive command signals takes up less space than a laddered scheme, which requires a separate input for each chip, and has less setup time than a serial transfer method. In one embodiment, the binary counting scheme may include the Gray code counting scheme. It will be appreciated that a number of semiconductor chips 110(0-N) in the stack can be any number, including 4, 8, 16, 32, etc.

Figure 2:
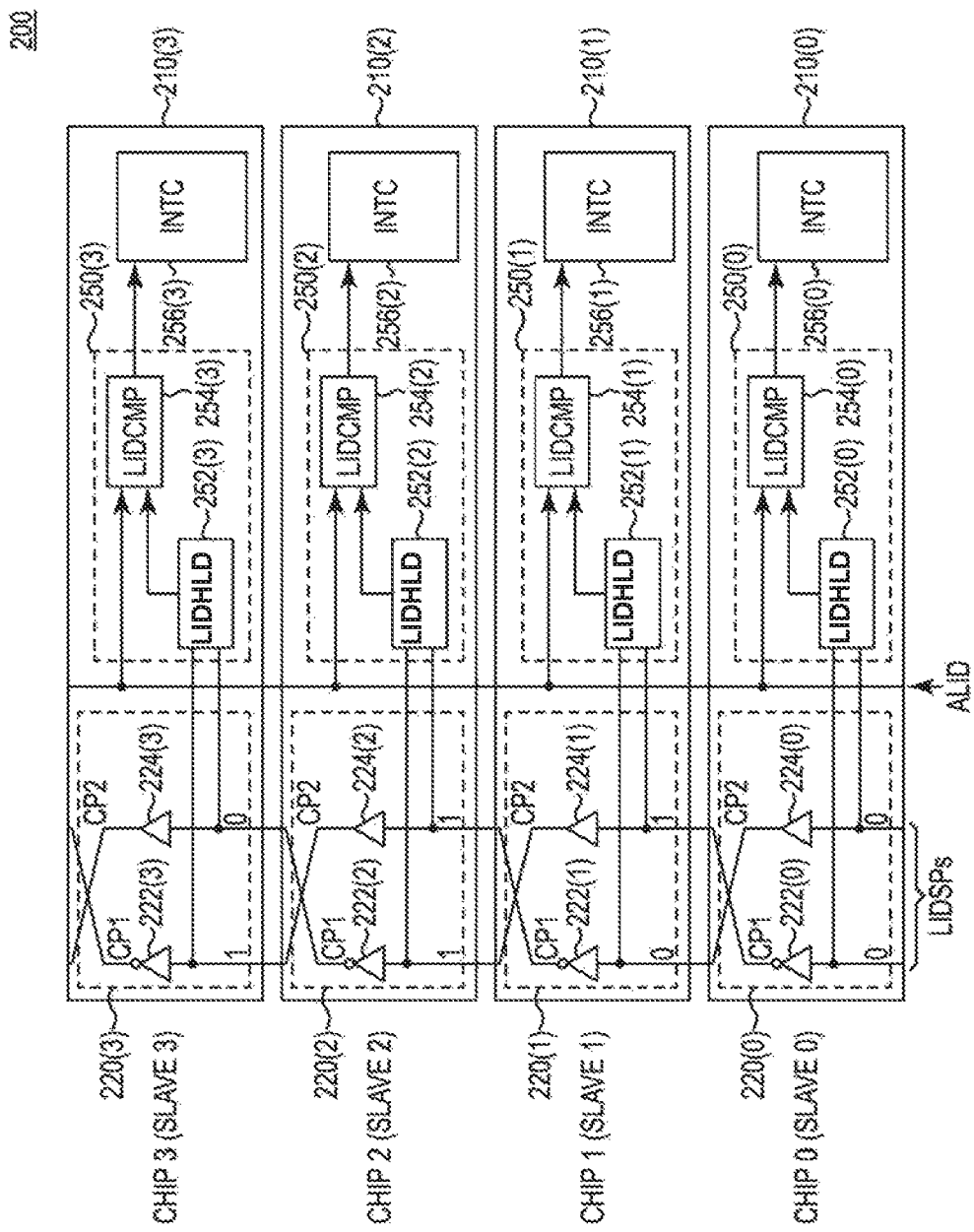
FIG. 2 is a block diagram of a particular illustrative embodiment of an apparatus including unique layer identification circuits in a memory package according to an embodiment of the disclosure.

Referring to FIG. 2, a particular illustrative embodiment of an apparatus 200 including a stack of semiconductor chips 210(0-3) in a memory package 204 is disclosed and generally designated apparatus 200. The semiconductor chips 210(0-3) may each include memory formed on separate semiconductor die. Each of the semiconductor chips 210(0-3) includes a respective LIDSP circuit 220(0-3) coupled to a respective UID circuit 250(0-3) and a respective internal circuit INTC 256(0-3) coupled to the respective UID circuit 250(0-3). The combination of the LIDSP circuit 220(0-3) and the UID circuit 250(0-3) may be used to enable a respective semiconductor chip 210(0-3) when received command signals are directed to the respective semiconductor chip 210(0-3). The semiconductor chips 210(0-3) may be implemented in the semiconductor chips 110(0-N) of FIG. 1.

Each of the LIDSP circuits 220(0-3) may include a respective inverter 222(0-3) that receives an input from a first LIDSP, and provides an output that has a value which is inverted relative to a value of the input (e.g., has an opposite logic level value) along a second LIDSP to form conductive path 1 CP1. Each of the LIDSP circuit 220(0-3) may further include respective buffers 224(0-3) that receive an input from a second LIDSP, and provides an output having a same value as the input along a first LIDSP to form conductive path 2. In some examples, the buffers 224(0-3) include an even number of inverters to provide an output having a same logical level as the input. Thus, the inverters 222(0-3) may invert the value along CP1 and the buffers 224(0-3) may propagate the value along CP2. In one embodiment, for example, each of the buffers 224(0-3) is substantially equal in delay time to a respective inverter 222(0-3).

Based on the inputs value received from the respective LIDSP circuits 220(0-3), each of the UID circuits 250(0-3) may receive two inputs, one from each of the CP1 and CP2, that are used to form the assigned unique layer identification information for the corresponding semiconductor chip 210(0-3). The unique layer identification information may be used to determine whether command signals from an external controller are directed to the corresponding semiconductor chip 210(0-3). In some embodiments, the unique layer identification information may also be used to determine whether a corresponding semiconductor chip 210(0-3) is a master or slave chip.

Each of the UID circuits 250(0-3) may include a respective layer identification hold circuit LIDHLD 252(0-3) configured to receive and hold the assigned unique layer identification information (i.e., the CP1 and CP2 values or two bits, in this example) from the LIDSP circuits 220(0-3). Each of the UID circuits 250(0-3) may further include a respective layer identification comparator circuit LIDCMP 254(0-3) configured to receive ALID signals, and to compare the ALID signals with the assigned unique layer identification information. The respective internal circuit INTC 256(0-3) is configured to receive the result of the comparison from the respective LIDCMP circuits 254(0-3), and if the assigned unique layer identification information matches the ALID information, the INTC 256(0-3) may respond to externally supplied commands.

During operation, except for an end semiconductor chip 210(0-3), the LIDSP circuits 220(0-3) of each of the semiconductor chips 210(0-3) may receive a set of inputs on the LIDSPs from a preceding semiconductor chip 210(0-3), and may adjust a value of one or more of the inputs to provide an output on the LIDSPs to a subsequent semiconductor chip 210(0-3). That is, for a given LIDSP circuit 220(0-3), the inverter 222(0-3) may invert the input received via the first LIDSP to provide the output to the second LIDSP to form the CP1, and the buffers 224(0-3) may propagate the input received via the second LIDSP to the first LIDSP to form the CP2. The values of along CP1 and CP2 prior to the inverters 222(0-3) and buffers 224(0-3), respectively, may represent the assigned unique layer identification information for the corresponding semiconductor chip 210(0-3). In this manner, by inverting one signal along CP1, leaving one signal the same along CP2 and intersecting CP1 and CP2, the semiconductor chips 210(0-3) may each be assigned unique layer identification information using only two LIDSPs.

Each of the LIDHLD circuits 252(0-3) may receive and hold the assigned unique identifier information. Each of the LIDCMP circuits 254(0-3) may compare the assigned unique identifier information with the received ALID and provide a chip enable signal having a value based on a result of the comparison. Each of the INTC 256(0-3) may respond to the received command signals responsive to the semiconductor chip enable signal indicating a match between the ALID and the assigned unique layer identification information. In some embodiments, the respective UID circuits 250(0-3) for each of the semiconductor chips 210(0-3) may also use the unique layer identification information to determine whether the corresponding semiconductor chip 210(0-3) is a master chip or a slave chip.

In some examples, the memory package 204 may be coupled to an interface chip, and the semiconductor chips 210(0-3) are not distinguished between master and slave chips (i.e., they are all one type of chip). Using a binary counting scheme to assign the unique layer identification information that is used to determine selection of a particular semiconductor chip for response to received command signals may take up less space than a laddered scheme, which requires a separate input for each semiconductor chip, and has less setup time than a serial transfer method.

Figure 3:
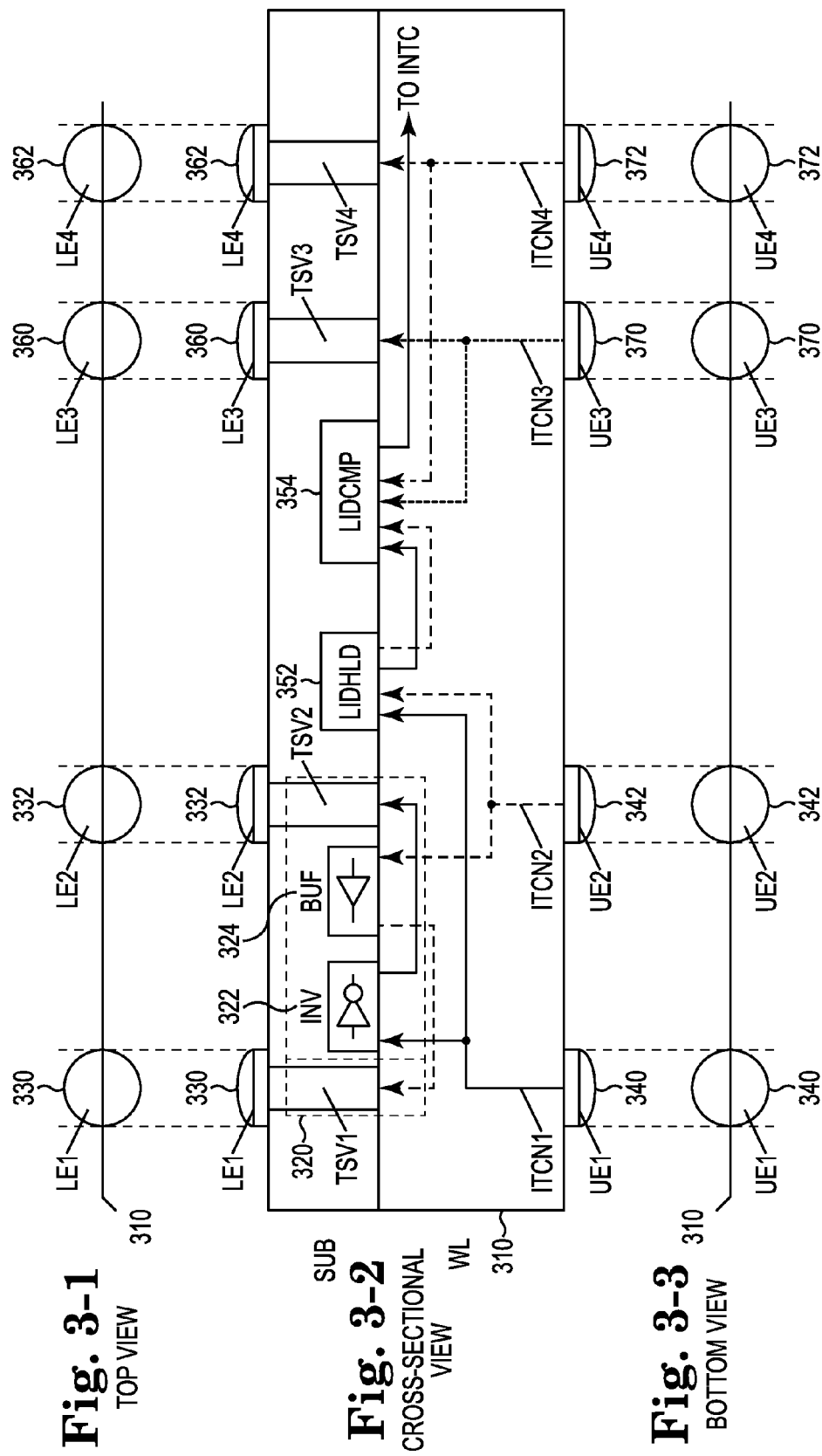

FIGS. 3-1, 3-2 and 3-3 depict a top view, a cross-sectional view, and a bottom view, respectively, of a semiconductor chip 310 of a memory die that employs the binary counting used to determine selection of a particular chip for response to received command signals according to an embodiment of the disclosure. The semiconductor chip 310 may be implemented in one or more of the semiconductor chips 110(0-N) of FIG. 1 and/or one or more of the semiconductor chips 210(0-3) of FIG. 2. In FIGS. 3-1, 3-2 and 3-3, the semiconductor chip 310 is depicted upside down because semiconductor chips in a chip stack structure may be, in some examples, stacked with each other in flip chip fashion.

The semiconductor chip 310 includes a semiconductor substrate SUB 304 and a wiring layer WL 306. The WL 306 may include a multi-level wiring structure in which a plurality of internal wiring layers may be formed. A plurality of lower electrodes LE1-LE4 (330, 332, 360, and 362) may be disposed on one side of the SUB 304. The plurality of LE1-LE4 (330, 332, 360, and 362) may be connected to a subsequent chip in a stack, and may provide output signals to the subsequent chip, such as unique identification information and ALID information. A plurality of upper electrodes UE1-UE4 (340, 342, 370, and 372) may be disposed on one side of the WL 306. The plurality of UE1-UE4 (340, 342, 370, and 372) may be connected to a previous chip in a stack, and may receive output signals from the previous chip, such as unique identification information and ALID information. A plurality of through substrate vias TSV1-TSV4 may be formed through the SUB 304. As depicted in FIG. 3, UEn(n=1-4), TSVn and LEn may be, but not limited to, aligned vertically with one another through the SUB 304 and the WL 306. A plurality of interconnections ITCN1-ITCN4 may be formed through the WL 306. Each of the interconnections INTC1-ITCN4 may be, but not limited to, formed as ones of internal wiring layers in the WL 306.

The SUB 304 may include a LIDSP circuit 320. The LIDSP circuit 320 may be implemented in one or more of the LIDSP circuits 120(0-N) of FIG. 1 and/or one or more of the LIDSP circuits 220(0-3) of FIG. 2. The LIDSP circuit 320 may include an inverter INV 322 and a buffer BUF 324. The interconnection ITCN1 may electrically couple the upper electrode UE1 340 to the through substrate via TSV2 with an intervention of the INV 322, which may result in transferring an input signal supplied to the upper electrode UE1 340 to the lower electrode LE2 332 as an output signal with inverting logic level of the input signal. The interconnection ITCN1 also can transfer the input signal supplied to the INV 322 to a LIDHLD circuit 352. The UE1 340, ITCN1, INV 322, TSV2 and LE2 332 may form a first conductive path CP1.

The interconnection ITCN2 may electrically couple the upper electrode UE2 342 to the through substrate via TSV1 with an intervention of the BUF 324, which may result in transferring an input signal supplied to the upper electrode UE2 342 to the lower electrode LE1 330 as an output signal with a same logic level of the input signal. In some embodiments, the BUF 324 may have substantially the same delay as the inverter INV 322. The UE2 342, ITCN2, BUF 324, TSV1 and LE1 330 may form a second conductive path CP2. The interconnection ITCN2 also can transfer the input signal supplied to the BUF 324 to the LIDHLD circuit 352.

The interconnection ITCN3 may electrically couple the upper electrode UE3 370 to the through substrate via TSV3 to provide a first of the ALID signals, which may result in transferring the first of the ALID signals from the upper electrode UE3 370 to the lower electrode LE3 360. The first bit of the ALID signals may also be provided to the LIDCMP circuit 354 from the ITCN3. The interconnection ITCN4 may electrically couple the upper electrode UE4 372 to the through substrate via TSV4 to provide a second of the ALID signals, which may result in transferring the second of the ALID signals from the upper electrode UE4 372 to the lower electrode LE4 362. The second of the ALID signals may also be provided to the LIDCMP circuit 354 from the ITCN3. Thus, converse to the interconnections ITCN1 and ITCN2, the interconnections ITCN3 and ITCN4 may be coupled TSV3 and TSV4, respectively, without intersecting with each other.

It will be appreciated that the example semiconductor chip 310 depicted in FIGS. 3-1, 3-2, and 3-3 would be for a stack of four or less semiconductor chips. Additional upper electrodes, lower electrodes, interconnections, TSVs, and circuitry of the LIDHLD circuit 352, the LIDCMP circuit, and the LIDSP circuit 320 may be required for memory packages have having more than four semiconductor chips.

Figure 4:
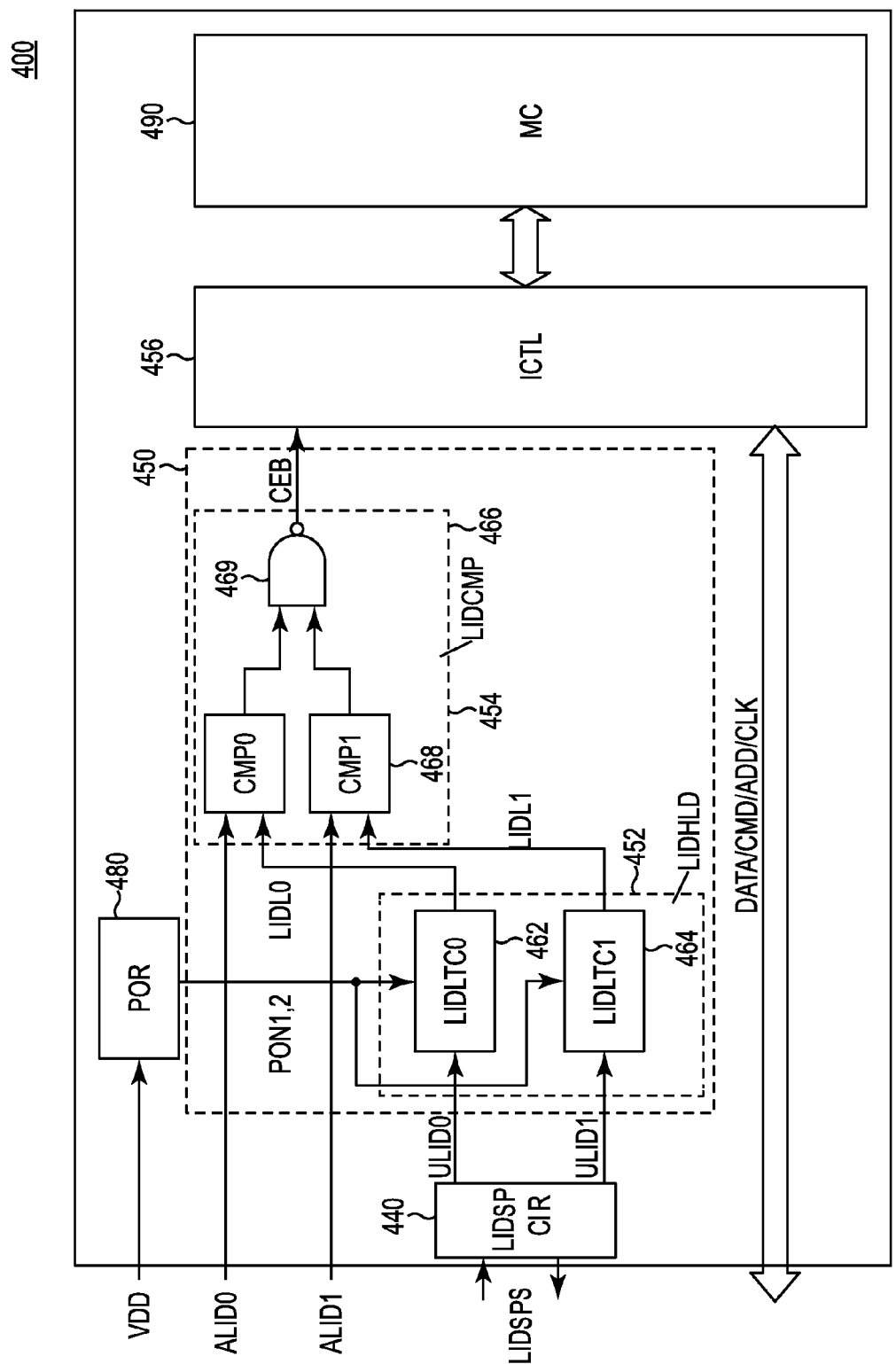
FIG. 4 is a block diagram of a particular illustrative embodiment of a semiconductor chip according to an embodiment of the disclosure.

FIG. 4 is a functional block diagram an example of one semiconductor chip 400 according to an embodiment of the disclosure. The semiconductor chip 400 may include a UID circuit 450 coupled to a LIDSP circuit 440 and configured to determine, when the semiconductor chip 400 is included in a stack, whether the semiconductor chip 400 is a master or slave memory chip and/or determine whether received command signals are directed to the semiconductor chip 400. All or a portion of the UID circuit 450 may be implemented in one or more of the UID circuits 150(0-N) of FIG. 1, one or more of the UID circuits 250(0-3) of FIG. 2, and/or the LIDHLD circuit 352 and the LIDCMP circuit 354 of FIG. 3. The UID circuit 450 may include a layer identification hold circuit LIDHLD circuit 452 and a layer identification comparator circuit LIDCMP circuit 454.

The semiconductor chip 400 may further include a power on reset circuit POR 480, an internal control circuit ICTL 456 and memory cell array MC memory circuit 490 for form an internal circuit (one or more of the INTC 256(0 3) of FIG. 2).

Figure 6:
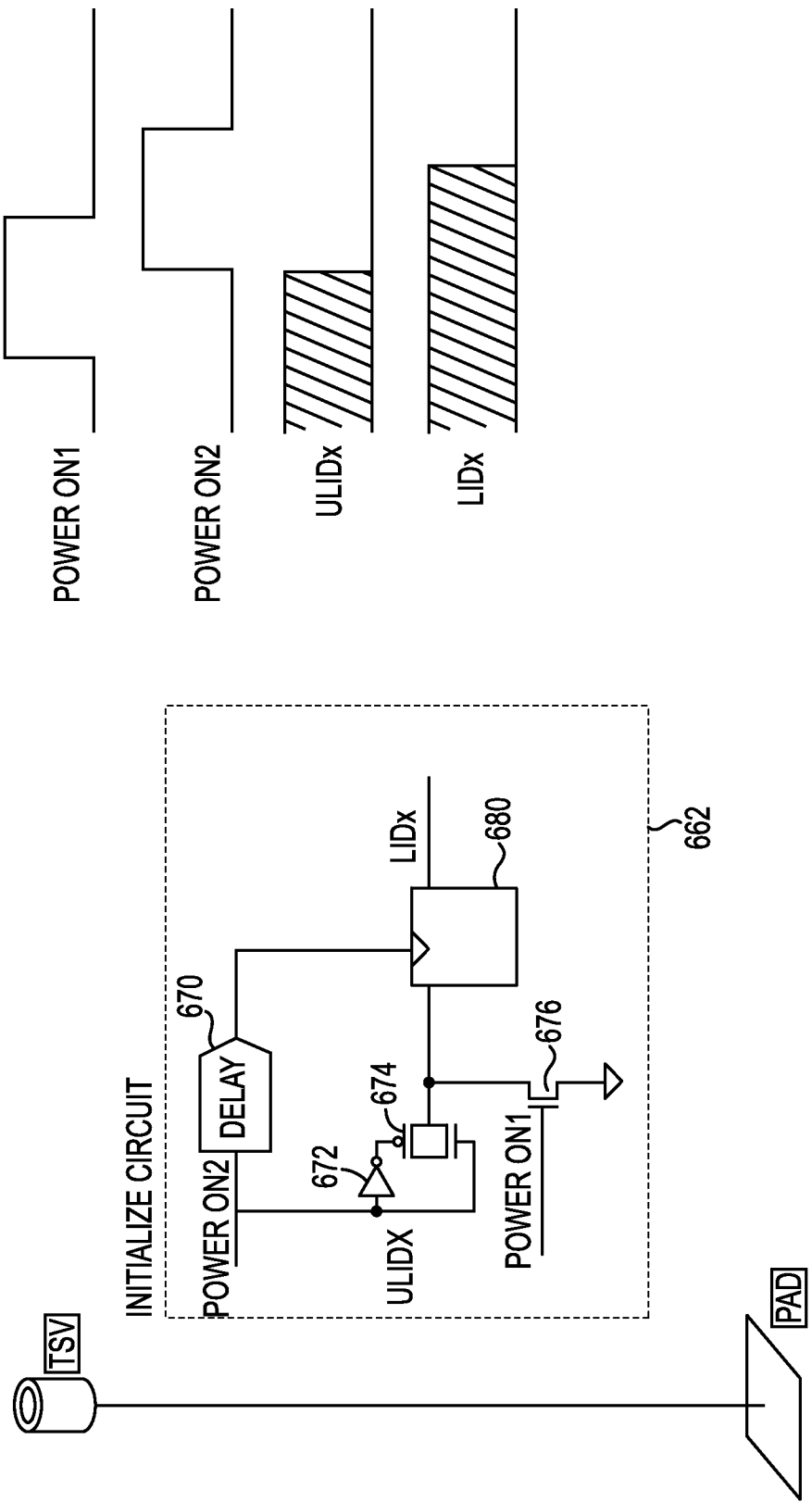
FIG. 6 is a block diagram of and timing diagram associated with a particular illustrative embodiment an layer identification latch circuit according to an embodiment of the disclosure.

The POR circuit 480 may provide reset signals PON1 and PON2 to the LIDHLD circuit 452 in response to power supply VDD. The LIDHLD circuit 452 may include a first layer identification latch circuit LIDLTC 462 and a second layer identification latch circuit LIDLTC1 464. The LIDLTC0 circuit 462 may be configured to receive the ULID0 signal and latch the LID0 signal at an output responsive to the PON1 and PON2 signals. The LIDLTC1 circuit 464 may be configured to receive the ULID1 signal and latch the LID1 signal at an output responsive to the PON1 and PON2 signals. An exemplary implementation of the LIDLTC0 circuit 462 and/or LIDLTC1 circuit 464 is depicted in FIG. 6. As would be recognized by one of skill in the art, other implementations may be used.

The LIDCMP circuit 454 may include a first compare circuit CMP0 466 and a second compare circuit CMP1 468 each coupled to a NAND gate 469. The CMP0 circuit 466 may receive the LID0 signal from the LIDLTC0 circuit 462 and the ALID0 signal, and may provide a result of a comparison between the LID0 and ALID0 signals at an output. The CMP1 circuit 468 may receive the LID1 signal from the LIDLTC1 circuit 464 and the ALID1 signal, and provide a result of a comparison between the LID1 and ALID1 signals at an output. The NAND gate 469 may receive the output of the CMP0 circuit 466 and the CMP1 circuit 468, and may provide a chip enable signal CEB to the internal control circuit 456 based on a NAND comparison between the two inputs. The CEB signal may indicate whether the semiconductor chip is enabled to respond to received command signals.

In operation, the UID circuit 450 may receive the ULID0 and ULID1 signals, which indicate unique layer identification information associated with the semiconductor chip 400. The UID circuit 450 may further receive the ALID0 and ALID1 signals, which indicate a target chip within a stack for execution of received command signals. The LIDHLD circuit 452 and the LIDCMP circuit 454 may provide CEB signal to the internal control circuit 456 based on a comparison of the ULID0 and ULID1 signals with the ALID0 and ALID1 signals. The CEB signal indicates whether the ULID0 and ULID1 signals match the ALID0 and ALID1 signals such that received command signals (e.g., DATA/CMD/ADD/CLK signals received at the internal control circuit 456) are directed to the semiconductor chip 400.

In the LIDHLD circuit 452, responsive to the PON1 and PON2 signals from the POR 480, the LIDLTC0 circuit 462 may receive and latch the ULID0 signal as the LIDL0 signal and the LIDLTC1 circuit 464 may receive and latch the ULID1 signal as the LIDL1 signal. In the LIDCMP circuit 454, the CMP0 circuit 466 may compare the LIDL0 signal with the ALID0 signal and the CMP1 circuit 468 may compare the LIDL1 signal with the ALID1 signal. The NAND gate 469 may provide the CEB signal based on a NAND comparison between the output of the CMP0 circuit 466 and the output of the CMP1 circuit 468. If the CEB signal has a first value, the internal control circuit 456 may ignore the received command signals (e.g., the DATA/CMD/ADD/CLK signals). If the CEB signal has a second value, the internal control circuit 456 may process the received command signals and communicate with the memory circuit 490 to execute the received command signals, such as reading data from the memory circuit 490 or writing data to the memory circuit 490.

It will be appreciated that the UID circuit 450 is depicted receiving two ULID signals and two ALID signals, along with the corresponding circuitry of the LIDHLD circuit 452 and the LIDCMP circuit 454 to process the two ULID and ALID signals. It will be appreciated that a count of each of the ULID and ALID signals may be based on a count of semiconductor chips in a memory stack. It will be appreciated that a count of the LIDLTC circuits in the LIDHLD circuit 452 and a count of the CMP circuits in the LIDCMP circuit 454 may be based on a count of each of the ULID and ALID signals. Thus, more than two ULID and two ALID signals may be received, the LIDHLD circuit 452 may include more than two LIDLTC circuits, and the LIDCMP circuit 454 may include more than two CMP circuits for memory stacks having more than 4 semiconductor chips.

Figure 5:
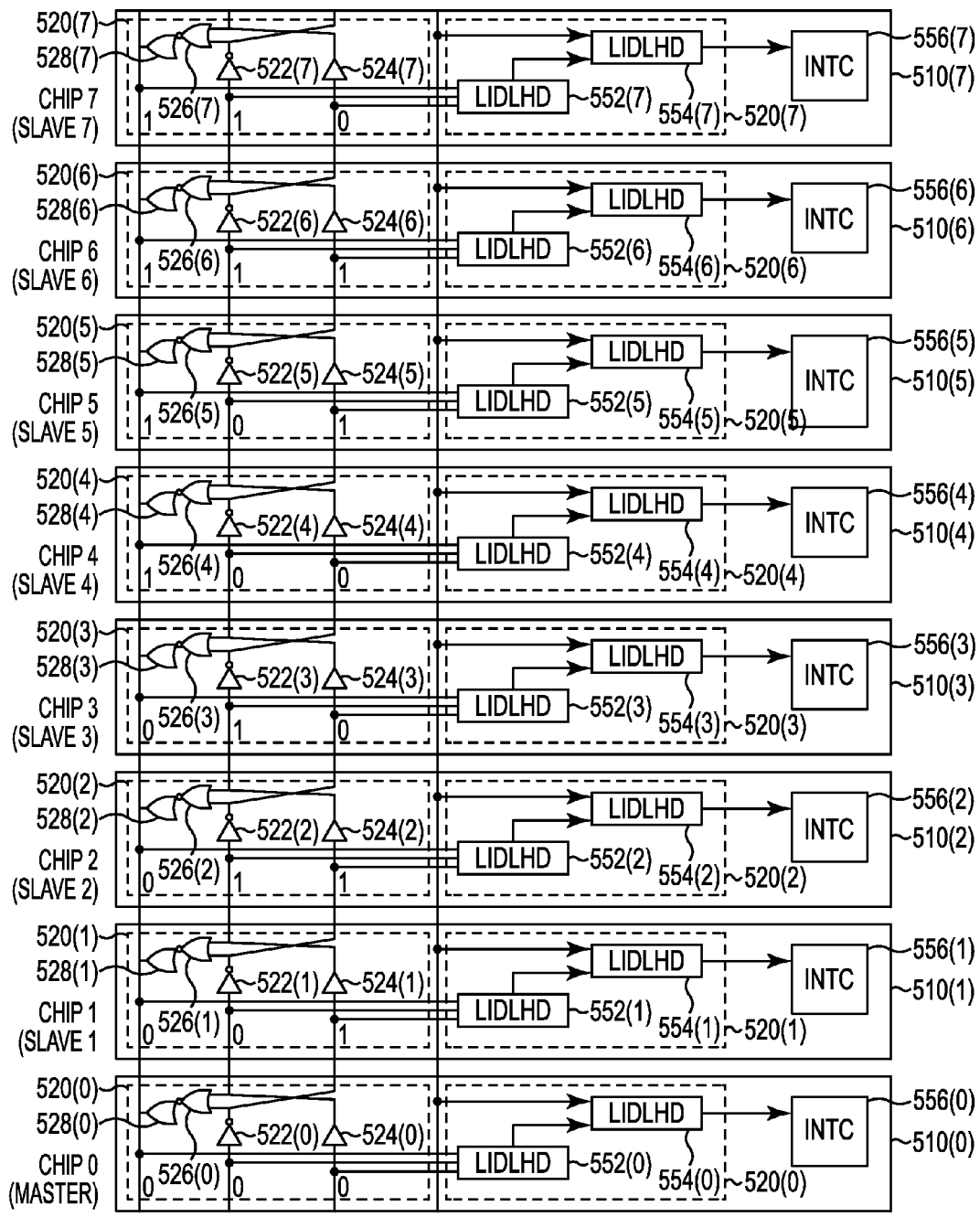
FIG. 5 is a block diagram of a particular illustrative embodiment of an apparatus including unique layer identification circuits in a memory package according to an embodiment of the disclosure.

Referring to FIG. 5, a particular illustrative embodiment of an apparatus 500 including a stack of semiconductor chips 510(0-7) in a memory package 504 is disclosed and generally designated apparatus 500. The semiconductor chips 510(0-7) may each include memory formed on separate semiconductor die. Each of the semiconductor chips 510(0-7) may include a respective LIDSP circuit 520(0-7) coupled to a respective UID circuit 550(0-7) and a respective internal circuit INTC 556(0-3) coupled to the respective UID circuit 520(0-7). The combination of the LIDSP circuit 520(0-7) and the UID circuit 550(0-7) may be used to enable a respective semiconductor chip 510(0-7) when received command signals are directed to the respective semiconductor chip 510(0-7). The semiconductor chips 510(0-7) may be implemented in the semiconductor chips 110(0-N) of FIG. 1.

Each of the LIDSP circuits 520(0-7) may include a respective inverter 522(0-7) that receives an input from a second LIDSP, and provides an output that has a value which is inverted relative to a value of the input (e.g., has an opposite logic level value) along a third LIDSP to form conductive path 1 CP1. Each of the LIDSP circuits 520(0-7) may further include respective buffers 524(0-7) that receive an input from a third LIDSP, and provides an output having a same value as the input along a second LIDSP to form conductive path 2. In some examples, the buffers 524(0-7) includes an even number of inverters to provide an output having a same logical level as the input. Thus, the inverters 522(0-7) may invert the value along CP1 and the buffers 524(0-7) may propagate the value along CP2. In one embodiment, for example, each of the buffers 524(0-7) is substantially equal in delay time to a respective inverter 522(0-7).

Each of the LIDSP circuits 520(0-7) may further include a respective NOR gate 526(0-7) that receives the output of the respective inverter 522(0-7) and receives the output of the respective buffers 524(0-7) and provides an output having a value based on a logical NOR comparison between the two received signals. Each of the LIDSP circuits 520(0-7) may further include a respective OR gate 528(0-7) that receives the output of the respective NOR gate 526(0-7) and receives an input from a first LIDSP and provides an output to the first LIDSP having a value based on a logical OR comparison between the two received signals to form conduction path CP3.

Based on the inputs values received from the respective LIDSP circuits 520(0-7), each of the UID circuits 550(0-7) may receive three inputs, one from each of the CP1, CP2, and CP3 that are used to form the assigned unique layer identification information for the corresponding semiconductor chips 510(0-7). The unique layer identification information may be used to determine whether memory command signals from an external controller are directed to the corresponding semiconductor chips 510(0-7). In some embodiments, the unique layer identification information may also be used to determine whether a corresponding semiconductor chip 510(0-7) is a master or slave chip.

Each of the UID circuits 550(0-7) may include a respective LIDHLD circuit 552(0-7) configured to receive and hold the assigned unique layer identification information (i.e., the CP1, CP2, and CP3 values or three bits, in this example) from the LIDSP circuits 520(0-7). Each of the UID circuits 550(0-7) may further include a respective LIDCMP circuit 554(0-7) configured to receive ALID signals, and to compare the ALID signals with the assigned unique layer identification information to provide a chip enable signal. The respective INTC 556(0-7) is configured to receive the chip enable signal form the respective LIDCMP circuits 554(0-7), and if the chip enable signal has a value that indicates a match between the assigned unique layer identification information and the ALID information, the INTC 556(0-7) may respond to received command signals.

During operation, except for an end semiconductor chip 510(0 or 7), the LIDSP circuits 520(0-7) of each of the semiconductor chips 510(0-7) may receive a set of inputs on the LIDSPs from a preceding semiconductor chip 510(0-7), and may adjust a value of one or more of the inputs to provide an output on the LIDSPs to a subsequent semiconductor chip 510(0-7). That is, for a given LIDSP circuit 520(0-7), the inverter 522(0-7) may invert the input on the second LIDSP to provide the output to the third LIDSP to form the CP1, and the buffers 524(0-7) may propagate the input on the third LIDSP to the second LIDSP to form the CP2. Further, the NOR gate 526(0-7) and the OR gate 528(0-7) may logically compare the output of the inverter 522(0-7), the output of the buffers 524(0-7), and the input received on the first LIDSP to provide an output on the first LIDSP to form the CP3. The values of along CP1, CP2, and CP3 prior to the inverter 522(0-7), buffers 524(0-7), and OR gate 528(0-7), respectively, represent the assigned unique layer identification information for the corresponding semiconductor chips 510(0-7). In other words, at least two significant bits of unique layer identification information assigned to semiconductor chips 510(0-7) may change in the Gray code manner along a stacked order. In this manner, by inverting one signal along CP1 and leaving one signal the same along CP2, and either inverting the signal along CP3 or leaving the signal along CP3 the same, and intersecting the CP1 and CP2, the semiconductor chips 510(0-7) may each be assigned unique layer identification information using only three LIDSPs.

Each of the LIDHLD circuits 552(0-7) may receive and hold the assigned unique identifier information. Each of the LIDCMP circuits 554(0-7) may compare the assigned unique identifier information with the received ALIDs and provide the chip enable signal based on the comparison at an output. Each of the INTC 556(0-7) may respond to the received command signals responsive to the chip enable signal indicating a match between the ALIDs and the assigned unique layer identification information. In some embodiments, the respective UID circuits 550(0-7) for each of the semiconductor chips 510(0-7) may also use the unique layer identification information to determine whether the corresponding semiconductor chip 510(0-7) is a master chip or a slave chip.

In some examples, the memory package 504 may be coupled to an interface chip, and the semiconductor chips 510(0-7) are not distinguished between master and slave chips (i.e., they are all one type of chip). Using a binary coding scheme to assign the unique layer identification information that is used to determine master and slave chips, and/or selection of a particular chip for response to received command signals takes up less space than a laddered scheme, which requires a separate input for each chip, and has less setup time than a serial transfer method.

FIG. 6 is a functional block diagram 600 and timing diagram 601 an example of a LIDLTCx circuit 662 according to an embodiment of the disclosure. The LIDLTCx circuit 662 may be configured to receive a unique layer identification signal ULIDx and latch the UNLIx signal as layer identification signal LIDx. The LIDLTCx circuit 662 may be implemented in one or more of the UID circuits 150(0-N) of FIG. 1, one or more of the LIDHLD circuits 252(0-3) of FIG. 2, the LIDHLD circuit 352 of FIG. 3, the LIDLTC0 circuit 462 and/or the LIDLTC0 circuit 462 of FIG. 4, and/or one or more of the LIDHLD circuits 552(0-7) of FIG. 5.

The LIDLTCx circuit 662 may receive a ULIDx signal, and first and second power on signals PON1 and PON2, respectively. The LIDLTCx circuit 662 may include a delay 670 coupled to a latch 680. The LIDLTCx circuit 662 may further include a pass gate 674 configured to receive the ULIDx signal, and provide the ULIDx signal to the latch 680 responsive to the PON2 signal. The PON2 signal may be inverted via an inverter 672 prior to being provided to a gate of the p-type transistor of the pass gate 674. The n-type transistor may receive the PON2 signal at a gate. The LIDLTCx circuit 662 may further include a pull-down transistor 676 coupled to a node between the output of the pass gate 674 and the latch 680 and a reference source. The pull-down transistor 676 may pull the node between the output of the pass gate 674 and the latch 680 to the reference source responsive to the PON1 signal received at the gate of the pull-down transistor 676. The latch 680 may latch the ULIDx signal received from the pass gate 674 responsive to the delayed PON2 signal received from the delay 670.

In operation, the LIDLTCx circuit 662 may receive the PON1 and PON2 signals. As shown in the timing diagram 601, the PON1 signal has a pulse that starts before the pulse on the PON2 signal. The pulse on the PON1 signal activates the pull-down transistor 676 to initialize the node between the pass gate 674 and the latch 680 to the reference source voltage prior to the pass gate 674 providing the ULIDx signal to the latch 680. After initialization, the pulse on the PON2 may activate the pass gate 674 to pass the ULIDx signal to the input of the latch 680. The delay 670 may delay the PON2 signal to allow the ULIDx signal time pass through the pass gate 674 and reach the input of the latch 680. The latch 680 may latch the ULIDx signal received from the pass gate 674 responsive to the delayed PON2 signal to provide the LIDx signal.

Figure 7:
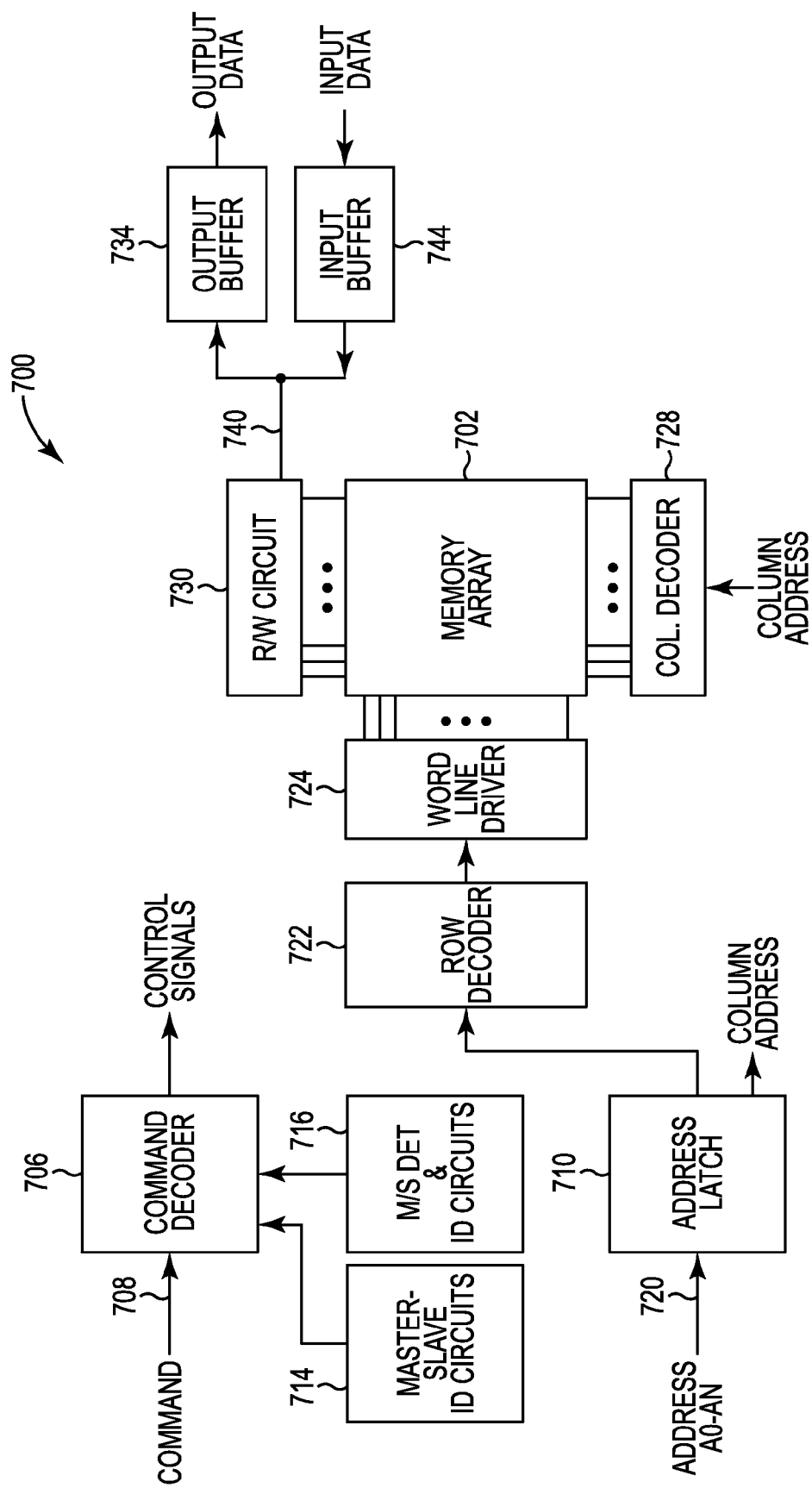
FIG. 7 is an illustration of a memory according to one embodiment of the disclosure.

Referring to FIG. 7, block diagram of a memory 700 including a UID circuit 716 according to an embodiment of the disclosure. The memory 700 may be included in a stack of memories. The memory 700 may include an array 702 of memory cells, which may be, for example, DRAM memory cells, SRAM memory cells, flash memory cells, or some other types of memory cells. The memory 700 includes a command decoder 706 that may receive memory commands through a command bus 708 and generate corresponding control signals within the memory 700 to carry out various memory operations. Row and column address signals may be applied to an address latch 710 in the memory 700 through an address bus 720. The address latch 710 may then output a separate column address and a separate row address.

The address latch 710 may provide row and column addresses to a row address decoder 722 and a column address decoder 728, respectively. The column address decoder 728 may select bit lines extending through the array 702 corresponding to respective column addresses. The row address decoder 722 may be connected to a word line driver 724 that activates respective rows of memory cells in the array 702 corresponding to received row addresses. The selected data line (e.g., a bit line or bit lines) corresponding to a received column address may be coupled to a read/write circuitry 730 to provide read data to a data output buffer 734 via an input-output data bus 740. Write data may be applied to the memory array 702 through a data input buffer 744 and the memory array read/write circuitry 730. The command decoder 706 may respond to memory commands applied to the command bus 708 to perform various operations on the memory array 702. In particular, the command decoder 706 may be used to generate internal control signals to read data from and write data to the memory array 702.

The memory 700 may further include a UID circuit 716 according to an embodiment of the disclosure. The UID circuit 716 may receive unique layer identification information signals ULID0-N and assigned layer identification signals ALID0-N, and may compare the ULID0-N signals with the ALID0-N signals to determine whether the received CMD signal 708, the input data, and/or the address A0-AN signals are directed to the 700. The UID circuit 716 may provide a result of the comparison to the 706, which may generate the control signals based on the signal received from the UID circuit 716. In some embodiments, the UID circuit 716 may include one or more of the UID circuits 150(0-N) of FIG. 1, the one or more of UID circuits 250(0-3) of FIG. 2, the LIDHLD circuit 352 and LIDCMP circuit 354 of FIG. 3, the UID circuit 450 of FIG. 4, the one or more of UID circuits 550(0-7) of FIG. 5, and/or the LIDLTCx circuit 662 of FIG. 6. For example, in a memory package, the semiconductor chip select detection circuit UID circuit 716 may be configured to identify whether memory commands, addresses, and data received from a memory controller (not shown) are intended for the memory 700 based on a corresponding chip select signal received from the memory controller. The chip select detection circuit UID circuit 716 may provide detection signals to the command decoder to provide control signals for a master memory unit or a slave memory unit based on the detection.

Those of ordinary skill would further appreciate that the various illustrative logical blocks, configurations, circuits, and algorithm steps described in connection with the embodiments disclosed herein may be implemented as electronic hardware, computer software executed by a processor, or combinations of both. Various illustrative components, blocks, configurations, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those having ordinary skill in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a semiconductor chip comprising:
a layer identification setting path circuit configured to receive respective input signals from a first plurality of layer identification setting paths and to provide respective output signals to a second plurality of layer identification setting paths, the layer identification setting path circuit further configured to change a value of a first input signal of the respective input signals received via a first setting path of the first plurality of layer identification setting paths to generate a first output signal of the respective output signals provided to a first setting path of the second plurality of layer identification setting paths, wherein the first setting path of the first plurality of layer identification setting paths is offset in a first direction from the first setting path of the second plurality of layer identification setting paths, and wherein the first plurality of layer identification setting paths are aligned with one another on an edge of the semiconductor chip in a second direction that is perpendicular to the first direction; and
an identification circuit configured to determine layer identification information based on the respective input signals and to compare the layer identification information to externally supplied access layer identification information, wherein the identification circuit is configured to enable the semiconductor chip to process received command signals based on the comparison between the layer identification information and the access layer identification information, and
wherein the identification circuit comprises a layer identification hold circuit and a layer identification comparator circuit,
wherein the layer identification hold circuit is configured to latch the respective input signals as the layer identification information and provide respective layer identification latch signals to the layer identification comparator circuit, and
wherein the layer identification comparator circuit is configured to receive the respective layer identification latch signals and externally supplied access layer identification information and provide a chip enable signal based on the comparison.

2. The apparatus of claim 1, wherein the layer identification setting path circuit comprises an inverter configured to invert the first input signal received via the first setting path of the first plurality of layer identification setting paths and to provide an inverted respective input signal as the first output signal of the respective output signals to the first setting path of the second plurality of layer identification setting paths.

3. The apparatus of claim 2, wherein the layer identification setting path circuit comprises a buffer configured to receive a second input signal via a second setting path of the first plurality of layer identification setting paths and to provide the second input signal as a second output signal to a second setting path of the second plurality of layer identification setting paths, and
wherein the second setting path of the first plurality of layer identification paths is offset from the second setting path of the second plurality of layer identification paths in the first direction.

4. The apparatus of claim 3, wherein the second setting path of the first plurality of layer identification paths is horizontally aligned with the first setting path of the second plurality of layer identification paths.

5. The apparatus of claim 3, wherein the layer identification setting path circuit comprises a NOR gate configured to receive the first output signal provided to the first setting path of the second plurality of layer identification setting paths and the second output signal provided to the second setting path of the second plurality of layer identification setting paths, and to provide a third output signal using NOR logic, and
wherein the layer identification setting path circuit further comprises an OR gate configured to receive the third output signal and a third input signal via a third setting path of the first plurality of layer identification setting paths, and to provide a fourth output signal using NOR logic to a third setting path of the second plurality of layer identification setting paths.

6. The apparatus of claim 1, wherein the layer identification hold circuit comprises a plurality of layer identification latch circuits, and
wherein a layer identification latch circuit of the plurality of layer identification latch circuits is configured to latch a respective one of the respective input signals.

7. The apparatus of claim 6, wherein the layer identification latch circuit comprises a pass gate coupled in series with a latch, wherein the pass gate is configured to provide the respective input signal to an input of the latch responsive to a control signal, and wherein the latch is configured to latch the respective input signal responsive to a delayed co control signal.

8. The apparatus of claim 1, wherein the identification circuit further comprises internal circuitry configured to receive the chip enable signal, the internal circuitry further configured to determine whether to process received command signals based on a logic level of the chip enable signal.

9. A method comprising:

receiving a first signal at a first input terminal of a semiconductor chip;

receiving a second signal at a second input terminal of the semiconductor chip;

inverting a logic level of the first signal to provide an inverted first signal;

buffering the second signal to provide a buffered second signal;

providing the buffered second signal to a first output terminal of the semiconductor chip, wherein the first output terminal is horizontally aligned with and vertically offset from the first input terminal on the semiconductor chip;

providing the inverted first signal to a second output terminal of the semiconductor chip, wherein the second output terminal is horizontally aligned with and vertically offset from the second input terminal on the semiconductor chip; and wherein the semiconductor chip comprises a hold circuit and a comparator circuit, wherein the hold circuit is configured to receive the first signal and the second signal and provide respective layer identification latch signals to the comparator circuit, and wherein the comparator circuit is configured to receive the respective layer identification latch signals and provide a third output signal to the semiconductor chip that receives and identifies a command signal based on the received chip enable signal, where the command signal is identified based on a comparison by the comparator circuit of unique identification information with an externally supplied access layer identification information.

10. The method of claim 9, further comprising processing received command signals based on the first and second signals.

11. The method of claim 10, wherein processing the received command signals comprises based on the first and second signals, reading from or writing to a memory based on the received command signals.

12. The method of claim 10, further comprising comparing the first and second signals with access layer identification information, wherein processing of the received command signals is based on the comparison.

13. The method of claim 12, wherein comparing the first and second signals with the access layer identification information comprises:

latching the first and second signals;

comparing the latched first and second signals with the access layer identification information, and providing a chip enable signal responsive to the latched first and second signals matching the access layer identification information.

14. The method of claim 9, further comprising:

receiving a third signal at a third input terminal of the semiconductor chip;

generating a fifth signal having a value based on the third signal, the inverted first signal, and the second signal; and providing the fifth output signal to a third output terminal of the semiconductor chip, wherein the third output terminal is horizontally aligned with and vertically offset from the third input terminal on the semiconductor chip.

15. The method of claim 14, wherein generating the output signal having the value based on the third signal, the inverted first signal, and the second signal comprises:

comparing the inverted first signal and the second signal using NOR logic to provide a fourth output signal; and comparing the fourth output signal and the third signal using OR logic to provide the fifth output signal.

* * * * *